(12) United States Patent
Li

(10) Patent No.: US 10,090,306 B2
(45) Date of Patent: Oct. 2, 2018

(54) FIN-FET DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 0 days.

(21) Appl. No.: 15/491,501

(22) Filed: Apr. 19, 2017

(65) Prior Publication Data
US 2017/0358578 A1    Dec. 14, 2017

(30) Foreign Application Priority Data

Jun. 13, 2016  (CN) .......................... 2016 1 0410566

(51) Int. Cl.
*H01L 27/092* (2006.01)
*H01L 21/8238* (2006.01)
(Continued)

(52) U.S. Cl.
CPC .. *H01L 27/0924* (2013.01); *H01L 21/823821* (2013.01); *H01L 21/823828* (2013.01);
(Continued)

(58) Field of Classification Search
CPC . H01L 27/0924; H01L 29/518; H01L 29/517; H01L 29/4925; H01L 21/823857;
(Continued)

(56) References Cited

U.S. PATENT DOCUMENTS

| 2013/0154002 A1 | 6/2013 | Kuo et al. |
| 2015/0206953 A1 | 7/2015 | Basker et al. |

(Continued)

OTHER PUBLICATIONS

The European Patent Office (EPO) the Extended European Search Report for 17174829.6 Nov. 9, 2017 8 Pages.

*Primary Examiner* — Moin Rahman
(74) *Attorney, Agent, or Firm* — Anova Law Group, PLLC

(57) ABSTRACT

A method for fabricating a Fin-FET includes forming a plurality of fin structures, an isolation layer, and an interlayer dielectric layer on an NMOS region of a substrate, forming a first opening in the interlayer dielectric layer to expose a portion of the fin structures. A region adjacent to a joint between a bottom surface and a sidewall surface of the first opening is a corner region. The method includes forming a high-k dielectric layer on the bottom and the sidewall surfaces of the first opening, a barrier layer on the high-k dielectric layer, and an N-type work function layer containing aluminum ions on the barrier layer. The method further includes performing a back-flow annealing process such that the portion of N-type work function layer at the corner region is thickened and contains diffused aluminum ions. Finally, the method includes forming a metal layer on the N-type work function layer.

17 Claims, 6 Drawing Sheets

(51) Int. Cl.
  *H01L 29/49*    (2006.01)
  *H01L 29/51*    (2006.01)
  *H01L 29/66*    (2006.01)
  *H01L 29/78*    (2006.01)

(52) U.S. Cl.
  CPC .............. *H01L 21/823857* (2013.01); *H01L 21/823864* (2013.01); *H01L 21/823878* (2013.01); *H01L 29/4925* (2013.01); *H01L 29/517* (2013.01); *H01L 29/518* (2013.01); *H01L 29/66795* (2013.01); *H01L 29/7851* (2013.01)

(58) Field of Classification Search
  CPC ..... H01L 21/823864; H01L 21/823878; H01L 21/823821; H01L 21/823828
  USPC ........ 438/136, 137, 455–458, 149–165, 173, 438/192, 206, 212, 424, 427, 428, 591; 257/20, 194, 135–136, 213–413, 900, 257/902–903
  See application file for complete search history.

(56) References Cited

U.S. PATENT DOCUMENTS

2015/0206963 A1* 7/2015 Ho .................... H01L 21/31111
                                                    257/411
2016/0163809 A1   6/2016 Ok et al.

* cited by examiner

US 10,090,306 B2

FIN-FET DEVICES AND FABRICATION METHODS THEREOF

CROSS-REFERENCES TO RELATED APPLICATIONS

This application claims the priority of Chinese Patent Application No. CN201610410566.0, filed on Jun. 13, 2016, the entire content of which is incorporated herein by reference.

FIELD OF THE DISCLOSURE

The present disclosure generally relates to the field of semiconductor fabrication technology and, more particularly, relates to a Fin-FET device and fabrication methods thereof.

BACKGROUND

With continuous development of semiconductor technology, the development of the semiconductor process node demonstrates a growing trend to fall off the Moore's law. In order to adapt to the decrease of the process node, the channel length in metal-oxide-semiconductor field-effect-transistor (MOSPET) has to be reduced. Reducing the channel length may benefit the increase of transistor density on the semiconductor chip and may also be conducive to improving the switching speed of the MOSFET.

However, with the decrease of the channel length in devices, the distance between the source region and the drain region of the device is also reduced. As such, the controllability of the gate electrode on the channel may be degraded and the gate voltage may not be able to pinch off the channel. As a result, the subthreshold leakage phenomena, e.g. the short-channel effects (SCEs), may easily occur.

Therefore, in order to meet the requirement due to scaling down of the size of the devices, semiconductor technology is gradually shifted away from conventional planar MOSFET to more efficient three-dimension (3D) transistor, such as fin field-effect-transistor (Fin-FET). In a Fin-FET, the gate may be able to control an ultra-thin structure (e.g. fin structure) from at least two side surfaces of the structure. Therefore, Fin-FETs may demonstrate much stronger gate-to-channel controllability than planar MOSFETs, and thus may efficiently suppress the SCEs. In addition, compared to some other devices, Fin-FETs may demonstrate better compatibility with existing manufacturing technology for integrated circuits.

However, the existing Fin-FET devices and fabrication methods may need to be further improved. The disclosed Fin-FET device and the fabrication methods are directed to solve one or more problems set forth above and other problems in the art.

BRIEF SUMMARY OF THE DISCLOSURE

One aspect of the present disclosure includes a method for fabricating a Fin-FET. The method includes forming a plurality of fin structures, an isolation layer, and an interlayer dielectric layer on a substrate. The substrate includes an N-type metal-oxide-semiconductor (NMOS) region. The isolation layer covers a portion of sidewall surfaces of the fin structures and has a top surface lower than top surfaces of the fin structures. The interlayer dielectric layer covers the isolation layer. The method also includes forming a first opening in the interlayer dielectric layer, across the fin structures in the NMOS region and exposing a portion of top and sidewall surfaces of the fin structures in the NMOS region. A region adjacent to a joint between a bottom surface and a sidewall surface of the first opening is a corner region. The method includes forming a high-k dielectric layer on the bottom and the sidewall surfaces of the first opening to cover the portion of the top and the sidewall surfaces of the fin structures exposed in the first opening, a barrier layer on the high-k dielectric layer in the first opening, an N-type work function layer containing aluminum ions on the barrier layer. The method further includes performing a back-flow annealing process on the N-type work function layer such that the N-type work function layer has a thickened portion at the corner region and a portion of the N-type work function layer at the corner region includes diffused aluminum ions. Moreover, the method includes forming a metal layer on the N-type work function layer to fill up the first opening.

Another aspect of the present disclosure provides a Fin-FET. The Fin-FET includes a plurality of fin structures, an isolation layer, and an interlayer dielectric layer formed on a substrate. The substrate includes an NMOS region. The isolation layer covers a portion of sidewall surfaces of the fin structures and has a top surface lower than top surfaces of the fin structures. The interlayer dielectric layer covers the isolation layer. The Fin-FET also includes a plurality of N-type gate structures formed in the interlayer dielectric layer across the fin structures in the NMOS region and covering a portion of top and sidewall surfaces of the fin structures in the NMOS region. Each N-type gate structure further includes a high-k dielectric layer formed on the portion of the top and the sidewall surfaces of the corresponding fin structure, a barrier layer formed on the high-k dielectric layer, an N-type work function layer formed on the barrier layer and containing aluminum ions, and a metal layer formed on the N-type work function layer. A joint between the sidewall surface and the bottom surface of a first opening formed in the interlayer dielectric layer during the formation of the N-type gate structure is a corner region, and a back-flow annealing process is performed on the N-type work function layer such that the N-type work function layer has a thickened portion at the corner region and a portion of the N-type work function layer at the corner region includes diffused aluminum ions.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
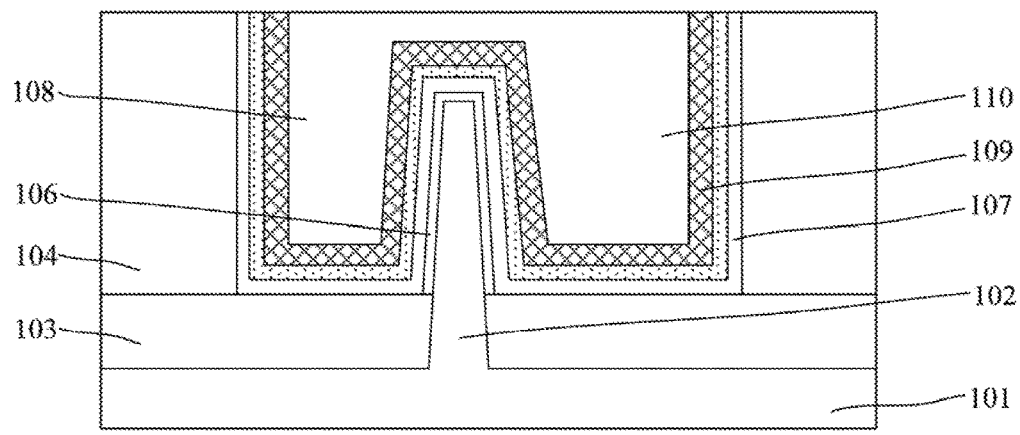
FIGS. 1-2 illustrate schematic cross-section views of semiconductor structures of an existing Fin-FET device.
Figure 2:
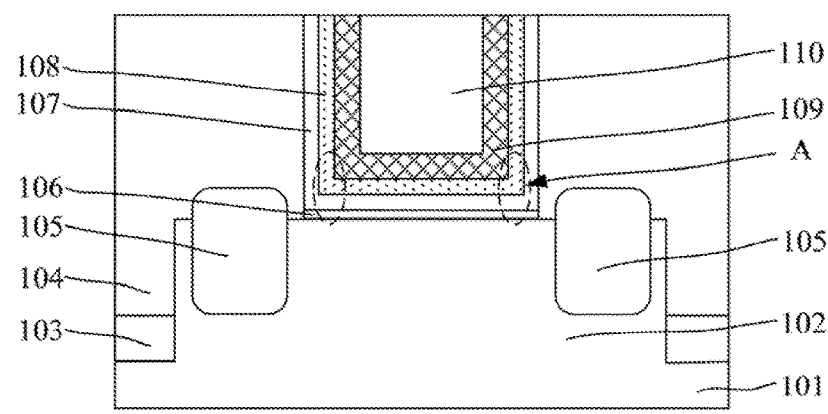

For Fin-FETs fabricated by existing methods, the electric performance may still need to be improved. FIGS. 1-2 show schematic cross-section views of an N-type metal-oxide-semiconductor (NMOS) Fin-FET fabricated by an existing method. Specifically, FIG. 1 shows a schematic cross-section view of the Fin-FET along a direction perpendicular to a length direction of the fin structure. FIG. 2 shows a schematic cross-section view of the Fin-FET along the length direction of the fin structure.

The fabrication method for the NMOS Fin-FET shown in FIGS. 1-2 includes providing a substrate 101, forming a fin structure 102 on the substrate, and forming an isolation layer 103 on the substrate to cover a portion of sidewall surfaces of the fin structure 102. The top surface of the isolation layer 103 is lower than the top surface of the fin structure 102.

The fabrication method also includes forming an interlayer dielectric layer 104 on the isolation layer 103 and forming an opening in the interlayer dielectric layer 104. The opening is formed across the fin structure 102 and exposes a portion of the top and sidewall surfaces of the fin structure 102.

The fabrication method further includes forming a source/drain region 105 in the fin structure 102 on each side of the opening, forming an interface layer on the bottom and sidewall surfaces of the opening, and forming a high-k dielectric layer 107 on the interface layer. The fabrication method then includes forming a barrier layer 108 on the high-k dielectric layer 107, forming an N-type work function layer 109 on the barrier layer 108, and finally forming a metal layer 110 on the N-type work function layer 109 to fill up the opening.

According to the fabrication method described above, the work function value of the material used to form the barrier layer 108 may be very different from the work function value of the material used to form the N-type work function layer 109. Specifically, the barrier layer 108 is usually made of TiN or TaN, and the work function value of TiN or TaN is usually larger than the work function value of an N-type work function material.

Referring to FIG. 2, the corner region A at the joint between the bottom and the sidewall of the opening are occupied by the barrier layer 108. Further, because the work function value of the material used to form the barrier layer 108 may be larger than the work function value of the material used to form the N-type work function layer 109, the gate structure may demonstrate weak controllability on the channel region under the corner region A. Therefore, the effective channel length of the channel region may be reduced, leading to SCEs. Moreover, because the corner region A is occupied by the barrier layer 108, and in the meantime, the corner region A is also close to the channel region, the barrier layer 108 at the corner region A may have significant impact on the threshold voltage. Specifically, the threshold voltage of the channel under the corner region A may be larger than the threshold voltages of the channels in other regions, which may also cause a reduced effective channel length, and further affect the electrical performance of the NMOS Fin-FET.

Further, the bottom dimension the portion of the fin structure 102 above the isolation layer 103 may be larger than the top dimension of the fin structure 102. Therefore, the gate structure may demonstrate better controllability on the channel region at the top of the fin structure 102 than on the channel region at the bottom of the fin structure 102, and thus the SCEs may easily take place in the channel region at the bottom of the fin structure 102.

Figure 13:
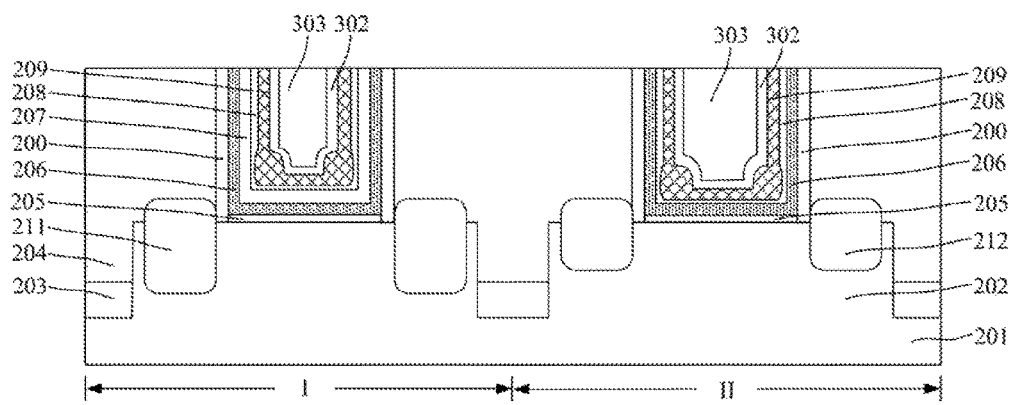
Figure 14:
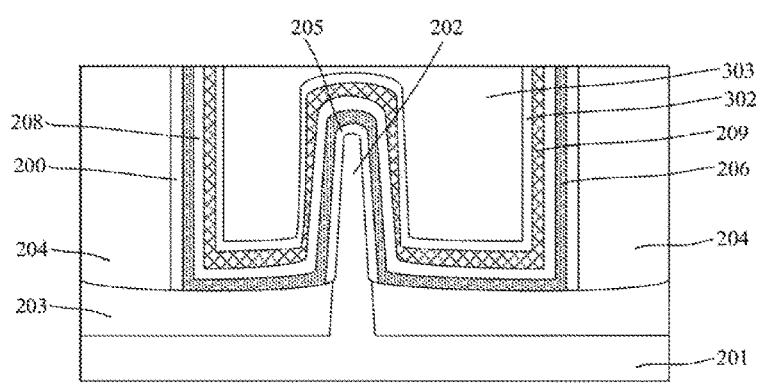
Figure 15:
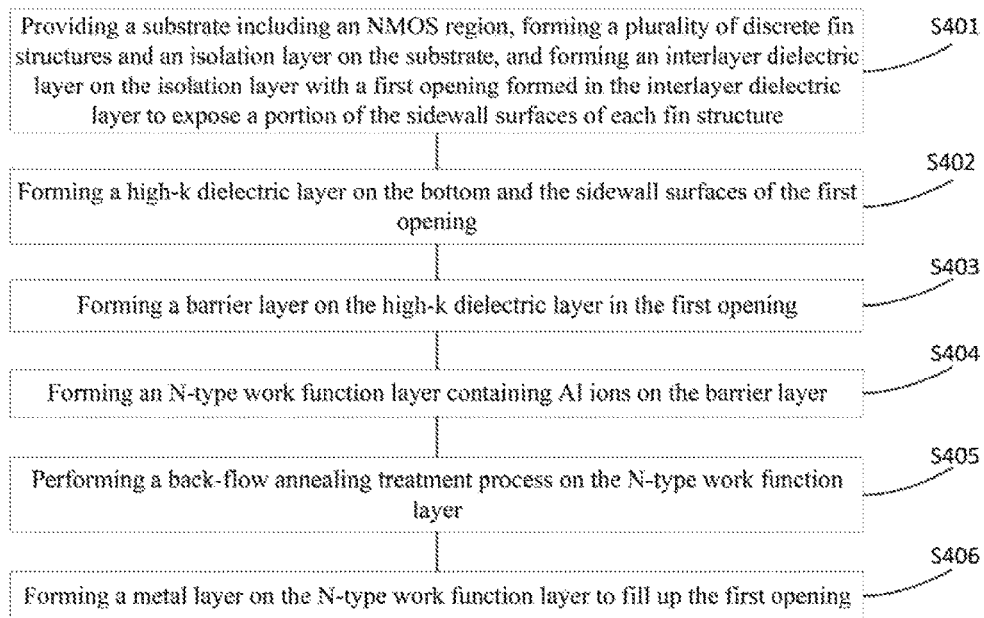
FIG. 15 illustrates a flowchart of an exemplary fabrication process consistent with disclosed embodiments.

The present disclosure provides a Fin-FET device and a method for forming the Fin-FET device. FIG. 15 shows a flowchart of an exemplary fabrication process consistent with disclosed embodiments. FIGS. 3-14 show schematic cross-section views of semiconductor structures corresponding to certain stages of the exemplary fabrication process.

Figure 3:
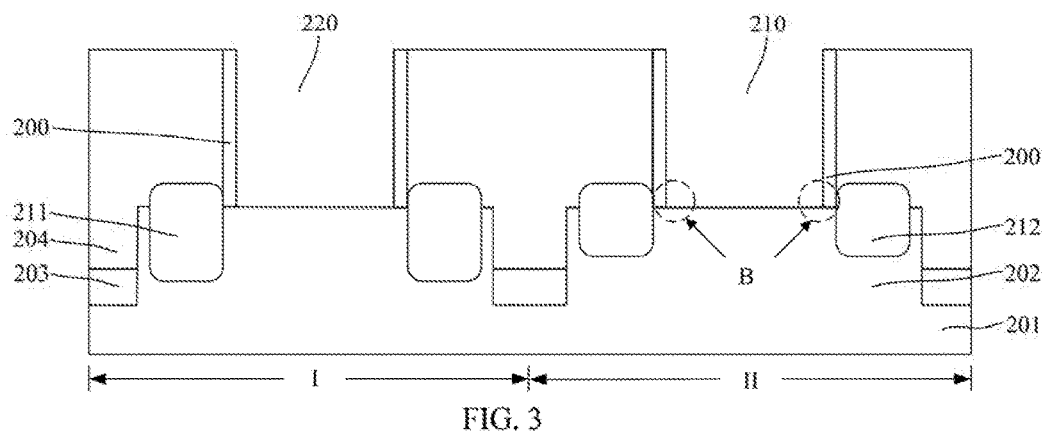
FIGS. 3-14 illustrate schematic cross-section views of semiconductor structures corresponding to certain stages of an exemplary fabrication process for Fin-FET devices consistent with disclosed embodiments.
Figure 4:
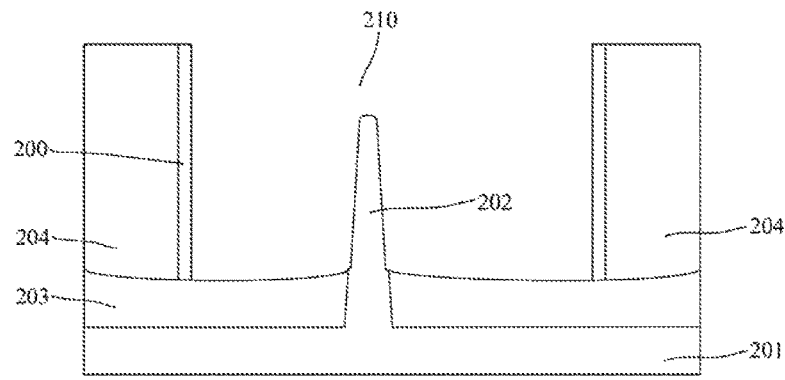

Referring to FIG. 15, at the beginning of the fabrication process, a substrate including an NMOS region may be provided, a plurality of discrete fin structures and an isolation layer may be formed on the substrate, an interlayer dielectric layer may be formed on the isolation layer, and a first opening may be formed in the interlayer dielectric layer in the NMOS region (S401). FIGS. 3-4 show schematic cross-section views of a corresponding semiconductor structure. Specifically, FIG. 3 shows a schematic cross-section view of the semiconductor structure along the length direction of the fin structure and FIG. 3 shows a schematic cross-section view of the semiconductor structure along a direction perpendicular to the length direction of the fin structure.

Referring to FIGS. 3-4, a substrate 201 including an NMOS region II may be provided. A plurality of fin structures 202 may be formed on the substrate 201. An isolation layer 203 may then formed on the substrate 201 to cover a portion of the sidewall surfaces of each fin structure 202. Specifically, the top surface of the isolation layer 203 may be lower than the top surfaces of the plurality of fin structures 202. An interlayer dielectric layer 204 may be formed on the isolation layer 203, and a first opening 210 may be formed in the interlayer dielectric layer 204 in the NMOS region II. The first opening 210 may be formed across the fin structures 202 in the NMOS region II and the first opening 210 may expose a portion of the top and the sidewall surfaces of each fin structure 202 the NMOS region II.

The substrate 201 may be made of silicon, germanium, SiGe, SiC, GaAs, InAs, or any other appropriate semiconductor material. The substrate 201 may also be made of silicon on insulator (SOI) or germanium on insulator (GOI). The plurality of fin structures 202 may be made of silicon, germanium. SiGe, SiC, GaAs, InAs, or any other appropriate semiconductor material. In one embodiment, the substrate 201 is made of silicon and the fin structures 202 are also made of silicon.

The plurality of fin structures 202 may be fabricated by a process including the following steps. First, an initial substrate may be provided. A patterned hard mask layer may then be formed on the surface of the initial substrate. Further, the initial substrate may be etched using the patterned hard mask layer as an etch mask. After etching, the etched initial substrate may become the substrate 201 and the plurality of protrusions formed on the surface of the substrate 201 may become the fin structures 202.

In one embodiment, the isolation layer 203 may be made of $SiO_x$. In another embodiment, the isolation layer may also be made of $SiN_x$ or SiON. In one embodiment, the isolation layer 203 may be fabricated by a process including the following steps. First, an isolation film may be formed on the substrate 201 to form the spaces between neighboring fin structures 202. The top surface of the isolation film may be higher than the top surfaces of the fin structures 202. Then, a planarization process may be performed on the top surface of the isolation film. Further, a portion of the isolation film may be removed by an etch-back process to expose a portion of the top and sidewall surfaces of the fin structures 202. As such the remaining portion of the isolation film may become the isolation layer 203. In one embodiment, because of the influence of the etch-back process, the top surface of the portion of the isolation layer 203 between neighboring fin structures 202 may be curved in.

The first opening 210 may be formed to pre-occupy a space for a subsequently-formed first gate structure. Further, the joint between the bottom and the sidewall of the first opening 210 may become a corner region B. In addition, a first source/drain doped region 212 may be formed in the fin structure 202 of the NMOS region II on each side of the first opening 210. The doping ions in the first source/drain doped region 212 may be N-type ions, such as P, As, and Sb.

In one embodiment, the Fin-FET to be formed may be a CMOS device and the substrate 201 may also include a PMOS region I. A second opening 220 may be formed in the portion of interlayer dielectric layer 204 formed in the PMOS region I. The second opening 220 may be formed across the fin structure 202 in the PMOS region I and may expose a portion of the top and the sidewall surfaces of the fin structure 202 in the PMOS region I.

The second opening 220 may be used to pre-occupy a space for a subsequently-formed second gate structure. Further, the joint between the bottom and the sidewall of the second opening 220 may become a corner region B. In addition, a second source/drain doped region 211 may be formed in the tin structure 202 of the PMOS region I on each side of the second opening 220. The doping ions in the second source/drain doped region 211 may be P-type ions, such as B, Ga, and In.

In order to prevent subsequent processes from affecting the width of the first opening 210 and the width of the second opening 220, a plurality of sidewall spacers 200 may be formed on the sidewalls of the first opening 210 and also on the sidewalls of the second opening 220. The sidewall spacers 200 may be made of a material different from the material used to form the interlayer dielectric layer 204. In one embodiment, the sidewall spacers 200 may be made of $SiN_x$.

Figure 5:
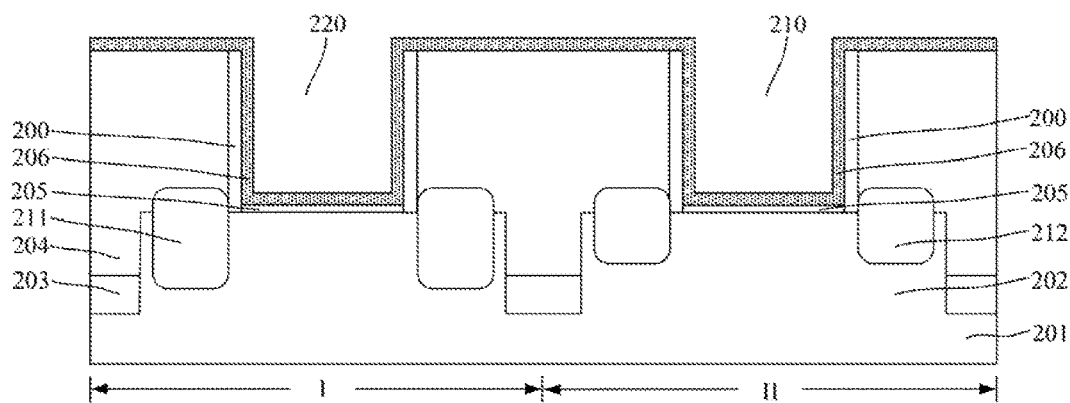
Figure 6:
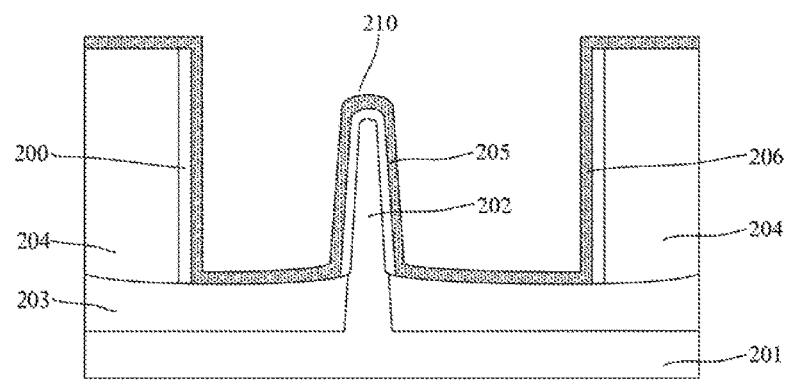

Further, returning to FIG. 15, a high-k dielectric layer may be formed on the bottom and the sidewall surfaces of the first opening (S402). FIGS. 5-6 show schematic cross-section views of a corresponding semiconductor structure. Specifically, FIG. 5 shows a schematic view developed from FIG. 3 while FIG. 6 shows a schematic view developed from FIG. 4. That is, FIG. 5 shows a schematic cross-section view of the semiconductor structure along the length direction of the fin structure and FIG. 6 shows a schematic cross-section view of the semiconductor structure along the direction perpendicular to the length direction of the fin structure.

Referring to FIGS. 5-6, a high-k dielectric layer 206 may be formed on the bottom and the sidewall surfaces of the first opening 210. The high-k dielectric layer 206 may also be formed on the exposed portion of the top and sidewall surfaces of the tin structure 202 in the NMOS region II.

In one embodiment, during forming the high-k dielectric layer 206 on the bottom and the sidewall surfaces of the first opening 210, the high-k dielectric layer 206 may also be simultaneously formed on the top and the sidewall surfaces of the second opening 220. In addition, the high-k dielectric layer 206 may also be formed on the top surface of the interlayer dielectric layer 204. Further, the high-k dielectric layer 206 may also be formed on a portion of the top and sidewall surfaces of the fin structure 202 exposed in the PMOS region I.

The high-k dielectric layer 206 may be made of a high-k dielectric material. Specifically, the high-k dielectric material may refer to a dielectric material with a relative dielectric constant greater than the relative dielectric constant of $SiO_x$. Specifically, the high-k dielectric material may include $HfO_2$, HtSiO, HfSiON, HfSiON, HfTaO, HfTiO, HfZrO, $ZrO_2$, $Al_2O_3$, etc.

In one embodiment, the high-k dielectric layer 206 may be made of $HfO_2$. The thickness of the high-k dielectric layer 206 may be in a range of approximately 5 Å to 15 Å. The high-k dielectric layer 206 may be formed by an atomic layer deposition (ALD) process.

Moreover, in order to improve the property of the interface between the high-k dielectric layer 206 and the fin structure 202 and also improve the quality of the formed high-k dielectric layer 206, an interface layer 205 may be formed on the bottom surfaces of the first opening 210 and the second opening 220 prior to forming the high-k dielectric layer 206. In one embodiment, the interface layer 205 may be formed by a thermal oxidation process and the interface layer 205 may be made of $SiO_x$. In other embodiments, the interface layer may also be made by an oxidation process combining chemical oxidation and thermal oxidation, or by any other appropriate oxidation process.

Figure 7:
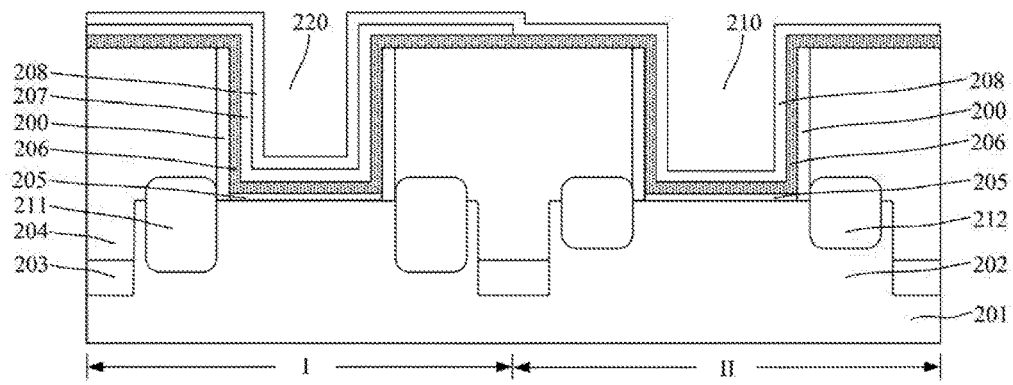
Figure 8:
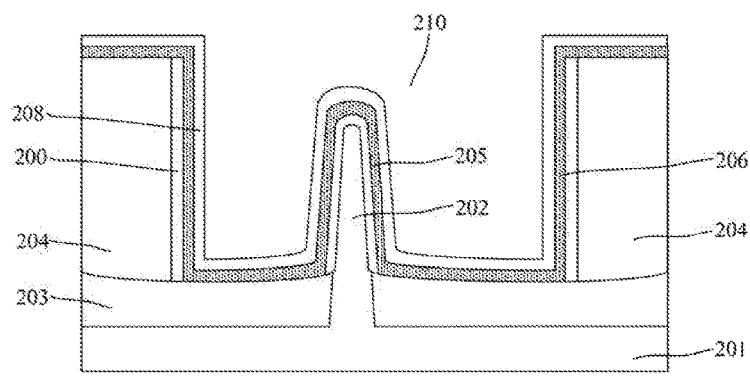

Further, returning to FIG. 15, a barrier layer may be formed on the high-k dielectric layer formed in the first opening (S403). FIGS. 7-8 show schematic cross-section views of a corresponding semiconductor structure. Specifically, FIG. 7 shows a schematic view developed from FIG. 5 and FIG. 8 shows a schematic view developed from FIG. 6. That is, FIG. 7 shows a schematic cross-section view of the semiconductor structure along the length direction of the fin structure and FIG. 8 shows a schematic cross-section view of the semiconductor structure along the direction perpendicular to the length direction of the fin structure.

Referring to FIGS. 7-8, a barrier layer may be formed on the high-k dielectric layer 206 in the first opening 210.

The barrier layer may have the following function during the fabrication of the Fin-FET device. During a subsequent fabrication process, an N-type work function layer may be formed in the first opening 210 and the N-type work function layer may also contain Al ions that may be easily diffused into the high-k dielectric layer 206. The barrier layer may be used to prevent the Al ions from diffusing into the high-k dielectric layer 206, and thus ensure that the electrical properties of the high-k dielectric layer 206 are still desired. In addition, the barrier layer may also prevent the Al ions from diffusing into the fin structure 202.

The work function value of the material of the barrier layer may be larger than the work function value of the material of the subsequently-formed N-type work function layer. In one embodiment, the barrier layer is made of TiN. In other embodiments, the barrier layer may also be made of TaN, or any other appropriate material.

In one embodiment, the Fin-FET device to be formed may be a CMOS device, and in a subsequent process, a P-type work function layer may be formed on the high-k dielectric layer 206 formed in the second opening 220. In order to simplify the fabrication process and reduce process difficulty, during the process to form the P-type work function layer, the barrier layer may be simultaneously formed.

For example, the barrier layer and the P-type work function layer may be formed by a process including the following steps. First, a first work function layer 207 may be formed on the high-k dielectric layer 206 formed in both the first opening 210 and the second opening 220. Then, a portion of the first work function layer 207 formed in the first opening 210 may be removed to expose the portion of the high-k dielectric layer formed in the first opening 210.

Further, a second work function layer may be formed on the high-k dielectric layer 206 in the first opening 210 and also on the first work function layer formed on the high-k dielectric layer 206 in the second opening 220. The second work function layer 208 formed on the portion of the high-k dielectric layer 206 in the first opening 210 may be used as the barrier layer. The portion of the first work function layer 207 and the second work function layer 208 formed on the high-k dielectric layer 206 in the second opening 220 may serve as the P-type work function layer.

The first work function layer 207 may be made of a P-type work function material. The work function value of the material used to form the first work function layer 207 may be in a range of approximately 5.1 eV to 5.5 eV, such as 5.2 eV, 5.3 eV, and 5.4 eV. In one embodiment, the first work function layer 207 may be made of TiN or TaN and may be formed by a chemical vapor deposition (CVD), physical vapor deposition (PVD), or ALD process.

The second work function layer 208 may be made of a P-type work function material. In one embodiment, the second work function layer 208 may be TiN or TaN and may be formed by a CVD, PVD, or ALD process.

Further, the thickness of the first work function layer 207 may not be too large; otherwise the etching time required to remove the portion of the first work function layer 207 formed in the first opening 210 may be very long. The thickness of the first work function layer 207 may not be too small either, otherwise, in order to meet the requirement on the threshold voltage for the subsequently-formed PMOS Fin-FET device, the thickness of the second work function layer 208 may need to be large, and thus the negative impact on the threshold voltage of the subsequently-formed NMOS Fin-FET due to the excessively large thickness of the second work function layer 208 in the first opening 210 may become more prominent.

In addition, the portion of the second work function layer 208 formed in the first opening 210 may serve as a barrier layer. Therefore, when the thickness of the second work function layer 208 is too small, the protection on the high-k dielectric layer 206 provided by the portion of the second work function layer 208 in the first opening 210 may be weak.

Therefore, in one embodiment, the first work function layer 207 is formed by TiN, the thickness of the first work function layer 207 is in a range of approximately 15 Å to 40 Å, the second work function layer 208 is made of TiN, and the thickness of the second work function layer 208 is in a range of approximately 10 Å to 20 Å. Accordingly, prior to a subsequently-performed back-flow annealing process, the thickness of the barrier layer is in a range of approximately 10 Å to 20 Å.

In other embodiments, when the Fin-FETs to be formed are NMOS Fin-FETs, the barrier layer may be directly formed on the high-k dielectric layer formed in the first opening. The material used to form the barrier layer may be TiN or TaN.

Figure 9:
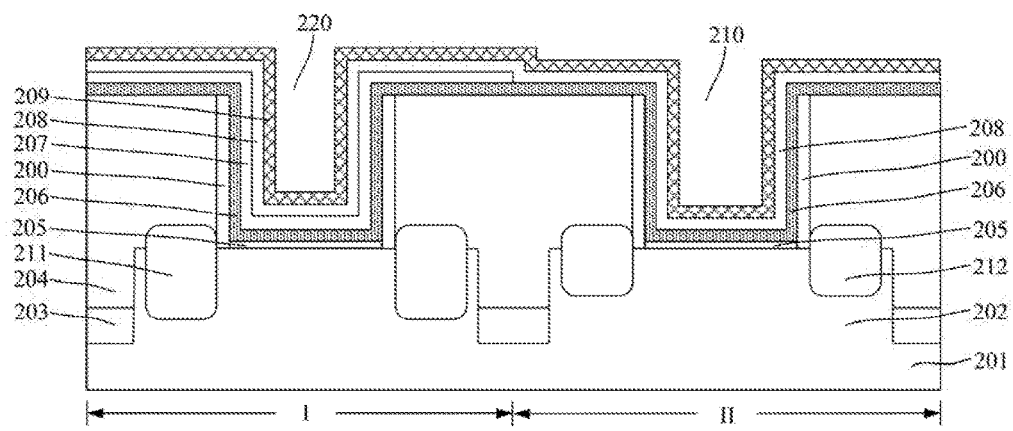
Figure 10:
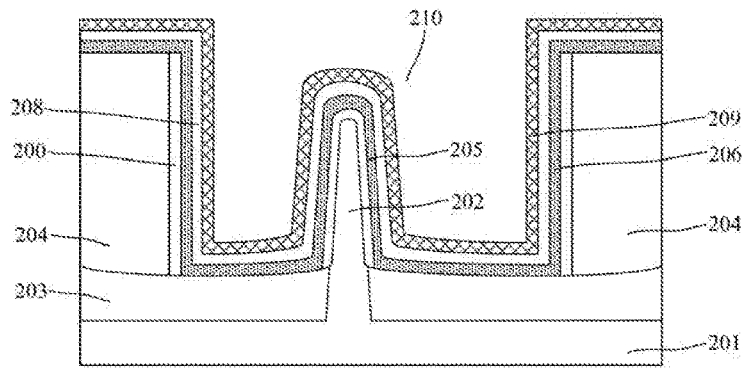

Further, returning to FIG. 15, an N-type work function layer containing Al ions may be formed on the barrier layer (S404). FIGS. 9-10 show schematic cross-section views of a corresponding semiconductor structure. Specifically, FIG. 9 shows a schematic cross-section view developed from FIG. 7 and FIG. 10 shows a schematic cross-section view developed from FIG. 8.

Referring to FIGS. 9-10, an N-type work function layer 209 may be formed on the barrier layer. The N-type work function layer 209 may contain Al ions.

Specifically, in one embodiment, the N-type work function layer 209 may be formed on the second work function layer 208 in the first opening 210. Besides being formed in the first opening 210, the N-type work function layer may also be formed on the top surface of the interlayer dielectric layer 204.

The N-type work function layer 209 may be made of an N-type work function material. The N-type work function material may have a work function value in a range of approximately 3.9 eV to 4.5 eV, such as 4.0 eV, 4.1 eV, and 4.3 eV. The N-type work function layer 209 may be formed by a CVD, PVD, or ALD process.

In one embodiment, the N-type work function layer 209 is made of TiAl and the thickness of the N-type work function layer 209 is in a range of approximately 33 Å to 88 Å. In other embodiment, the N-type work function layer may also be made of TiAlC, TiAlN, or AlN.

In one embodiment, during the formation of the N-type work function layer 209 on the barrier layer, the N-type work function layer 209 may also be formed on the second work function layer 208 formed in the second opening 220. In addition, in order to reduce process difficulty and save photomask, after forming the N-type work function layer 209 on the second work function layer 208 through a deposition process, the portion of the N-type work function layer 209 formed in the second opening 220 may be kept. That is, the portion of the N-type work function layer in the second opening 220 may not be removed. In other embodiments, in order to prevent undesired influence of the N-type work function layer in the second opening on the threshold voltage of the subsequently-formed PMOS Fin-FET device, the portion of the N-type work function layer formed in the second opening may be removed.

Figure 11:
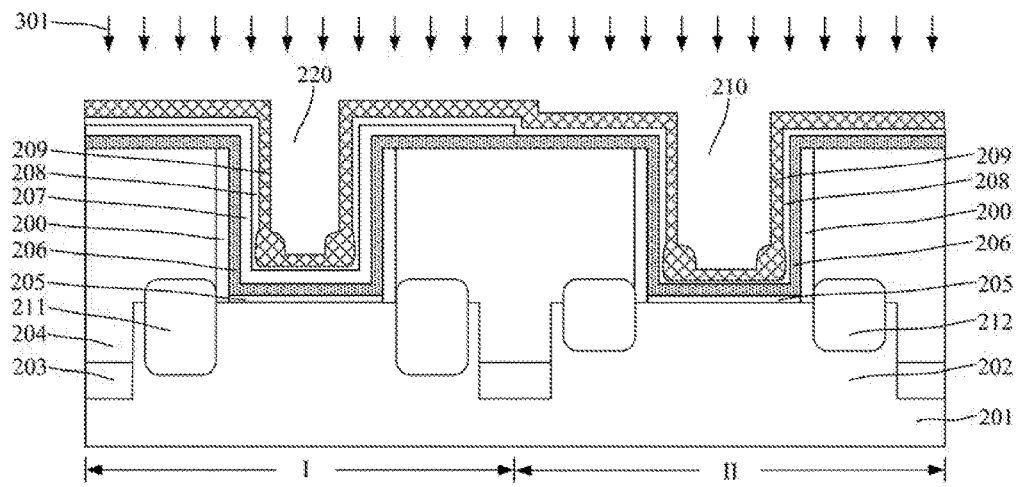
Figure 12:
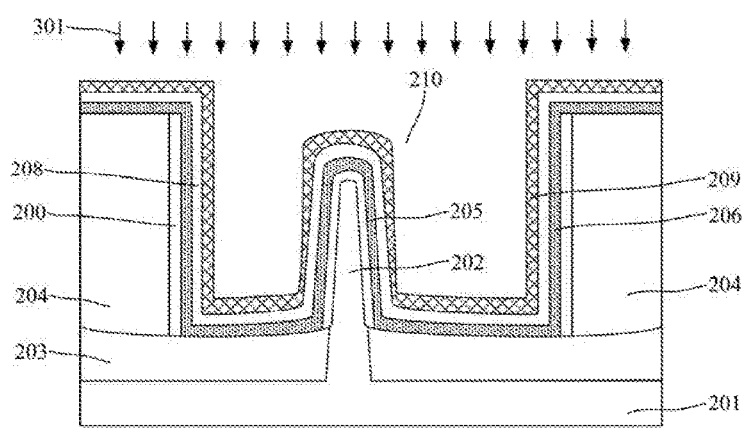

Further, returning to FIG. 15, a back-flow annealing process may be performed on the N-type work function layer (S405). FIGS. 11-12 show schematic views of a corresponding semiconductor structure during the back-flow annealing process. Specifically, FIG. 11 shows a schematic cross-section view developed from FIG. 9 and FIG. 12 shows a schematic cross-section view developed from FIG. 10.

Referring to FIGS. 11-12, a back-flow annealing process 301 may be performed on the N-type work function layer 209. The back-flow annealing process 301 may be able to increase the thickness of the portion of the N-type work function layer 209 formed in the corner region at the joint between the bottom and the sidewall of the first opening 210. In addition, the back-flow annealing process 301 may also allow the Al ions in the N-type work function layer 209 in the corner region to be diffused into the barrier layer.

In one embodiment, the back-flow annealing process 301 may allow the Al ions in the N-type work function layer in the corner region to be diffused into the second work function layer 208 formed in the first opening 210 so that the thickness of the second work function layer 208 in the corner region may become smaller. Therefore, the barrier height due to the portion of the work function layer 208 in the corner region may be reduced, and the effective channel length in the NMOS region II may become longer. As such, the controllability of a subsequently-formed first gate structure in the NMOS region II on the channel region may be improved, and thus the electrical performance of the formed Fin-FET device may also be improved.

During the back-flow annealing process 301, the portion of the N-type work function layer 209 formed on the sidewall of the first opening 210 may be in a melted state. Further, the portion of the N-type work function layer 209 formed on the sidewall of the first opening 210 may tend to accumulate in the corner region under the action of gravity, leading to an increased thickness for the N-type work function layer in the corner region. Moreover, during the back-flow annealing process 301, the Al ions in the N-type work function layer may diffuse into the barrier layer, and thus a portion of the barrier layer may be converted to a portion of the N-type work function layer 209. Specifically, the Al ions in the portion of the N-type work function layer 209 in the corner region may diffuse into the barrier layer.

Because the thickness of the portion of the N-type work function layer 209 in the corner region may be large, the concentration of Al ions diffused into the barrier layer in the corner region may also be large. Therefore, after the back-flow annealing process, the concentration of Al ions in the barrier layer situated in the corner region may be large. Further, the distance for the Al ions to be diffused into the barrier layer in the corner region may be large. That is, the portion of the barrier layer converted into a portion of the N-type work function layer may have a large thickness. Therefore, after performing the back-flow annealing process 301, the thickness of the barrier layer in the corner region may be smaller than the thickness of the barrier layer in other regions of the semiconductor structure.

The annealing temperature during the back-flow annealing process may not be too low or too high. Specifically, when the annealing temperature is too low, the flowability of the N-type work function layer 209 may not be desired, and thus the thickness of the N-type work function layer 209 in the corner region may still be small after the back-flow annealing process. As such, the number of the Al ions diffused into the barrier layer in the corner region may also be small. When the annealing temperature is too high, the Al ions may penetrate through the barrier layer and enter the high-k dielectric layer 206, and thus affect the property of the high-k dielectric layer 206. Similarly, because the concentration of Al ions in the barrier layer formed in the corner region may be relatively high, to prevent the Al ions from diffusing into the high-k dielectric layer 206, the annealing time may also be controlled within a reasonable range.

In one embodiment, the process parameters used in the back-flow annealing process 301 may include an annealing temperature in a range of approximately 100° C. to 300° C., an annealing time in a range of approximately 10 min to 12 min, and a process environment including $N_2$, Ar, or He.

In one embodiment, the portion of each fin structure 202 formed above the top surface of the isolation layer 203 may include a fin-structure bottom region and a fin-structure top region situated above the fin-structure bottom region. The back-flow annealing process 301 may also decrease the thickness of the portion of the N-type work function layer 209 formed on the sidewall surface of the fin-structure bottom region.

Because the isolation layer 203 between neighboring fin structures 202 shows a curved-in top surface, during the back-flow annealing process 301, the melted N-type work function layer 209 may accumulate on the curved-in surface so that the thickness of the portion of the N-type work function layer formed on the sidewall of the fin-structure bottom region may be smaller.

Further, the bottom dimension of each fin structure 202 formed above the isolation layer may be greater than the top dimension of the fin structure 202. Therefore, compared to the portion of the subsequently-formed gate structure on the top region of the fin structure 202, the portion of the gate structure on the fin-structure bottom region may demonstrate weaker controllability on the short channel of the channel region. Thus, the source-drain punch through problem may easily occur in fin-structure bottom region. In one embodiment, as the portion of the N-type work function layer 209 formed on the sidewall of the fin-structure bottom region becomes thinner, the threshold voltage of the portion of the device corresponding to the fin-structure bottom region may increase. The increase in the threshold voltage of the portion of the device that corresponds to the tin-structure bottom region may compensate or counteract the weak short-channel controllability caused by the large width of the fin-structure bottom region. Therefore, the portion of the subsequently-formed first gate structure in the fin-structure bottom region may also demonstrate desired short-channel controllability, and thus the source-drain punch through problem may not occur in the tin-structure bottom region.

In one embodiment, prior to performing the back-flow annealing process 301, the thickness of the portion of the N-type work function layer 209 formed on the sidewall surface of the fin-structure bottom region may be in a range of approximately 33 Å to 88 Å. After the completion of the back-flow annealing process 301, the thickness of the portion of the N-type work function layer 209 on the sidewall surface of the fin-structure bottom region may not be too small; otherwise, the threshold voltage of the channel region in the portion of the device corresponding to the fin-structure bottom region may be too large, leading to an overly large required voltage for switching the channel region. Moreover, after the completion of the back-flow annealing process 301, the thickness of the portion of the N-type work function layer 209 on the sidewall surface of the fin-structure bottom region may not be too large either; otherwise, the short-channel controllability of the subsequently-formed first gate structure in the region corresponding to the fin-structure bottom region may still be weak.

Therefore, in one embodiment, after performing the back-flow annealing process 301, the thickness of the portion of the N-type work function layer 209 formed on the sidewall surface of the fin-structure bottom region may be in a range of approximately 30 Å to 80 Å.

Further, returning to FIG. 15, a metal layer may be formed on the N-type work function layer to fill up the first opening (S406). FIGS. 13-14 show schematic cross-section view of a corresponding semiconductor structure. Specifically, FIG. 13 shows a schematic cross-section view of the semiconductor structure developed from FIG. 11 and FIG. 14 shows a schematic cross-section view of the semiconductor structure developed from FIG. 12.

Referring to FIGS. 13-14, after performing the back-flow annealing process, a metal layer 303 may be formed on the N-type work function layer 209 to fill up the first opening 210 (referring to FIGS. 11-12).

Moreover, in one embodiment, the fabrication process may also include forming a cap layer 302 on the N-type work function layer 209 prior to the formation of the metal layer 303 in order to prevent mobile ions in the subsequently-formed metal layer 303 from diffusing into the N-type work function layer 209. The cap layer 302 may be made of TiN or TaN.

In one embodiment, the Fin-FET device to be formed is a COMS device. Accordingly, the cap layer 302 may also be formed on the surface of the P-type work function layer and fill up the second opening 220 (referring to FIG. 11). The portion of the metal layer 303 formed in the second opening 220 may cover the surface of the corresponding cap layer 302 formed in the second opening 220.

In one embodiment, the metal layer 303 may be made of W and may be formed by a CVD process. In other embodiments, the metal layer may also be made of Cu, Al, or any other appropriate metal; in addition, the metal layer may also be formed by a PVD or ALD process.

Prior to forming the metal layer 303, the high-k dielectric layer 206, the barrier layer, and the N-type work function layer 209 may also be formed on the top surface of the interlayer dielectric layer 204. The fabrication process for the metal layer 303 may include forming a metal film on the N-type work function layer 209 to fill up the first opening 210. In one embodiment, a metal film may be formed on the cap layer 302 to fill up the first opening 210 and also the second opening 220. Specifically, the top surface of the metal film may be higher than the top surface of the interlayer dielectric layer 204. Further, the portion of the metal film formed above the top surface of the interlayer dielectric layer 204 may be removed to form the metal layer 303. In addition, the portion of the cap layer 302, the N-type work function layer 209, the barrier layer, and the high-k dielectric layer formed above the top surface of the interlayer dielectric layer 204 may also be removed during the process to remove the portion of the metal film formed above the top surface of the interlayer dielectric layer 204.

Further, after forming the metal layer 303, the portion of the high-k dielectric layer 206, the barrier layer, the N-type work function layer 209, the cap layer 302, and the metal layer 303 formed in the first opening 210 may together form a first gate structure; while the portion of the high-k dielectric layer, the P-type work function layer, the N-type work function layer 209, the cap layer 302, and the metal layer formed in the second opening 220 may together form a second gate structure.

The present disclosure also provides a Fin-FET device. FIGS. 13-14 show schematic cross section views of an exemplary Fin-FET device consistent with the disclosed embodiments. Specifically, FIG. 13 shows a schematic cross-section view of the Fin-FET device along the length direction of the fin structure and FIG. 14 shows a schematic cross-section view of the Fin-FET device along a direction perpendicular to the length direction of the fin structure.

Referring to FIGS. 13-14, the Fin-FET device may include a substrate 201 and a plurality of fin structures 202 formed on the substrate 201. The substrate 201 may further include a PMOS region I and a NMOS region II. The Fin-FET may also include an isolation layer 203 formed on the substrate 201 to cover a portion of sidewall surfaces of the fin structures 202. The top surface of the isolation layer 203 may be lower than the top surfaces of the plurality of fin structures 202. Moreover, the top surface of the isolation layer 203 may be slightly curved-in. The Fin-FET may also include an interlayer dielectric layer 204 formed on the isolation layer 203 and covering the plurality of fin structures 202.

The substrate 201 may be made of silicon, germanium, SiGe, SiC, GaAs, InAs, or any other appropriate semiconductor material. The substrate 201 may also be made of SOI or GOI. The plurality of fin structures 202 may be made of silicon, germanium, SiGe, SiC, GaAs, InAs, or any other appropriate semiconductor material. In one embodiment, the substrate 201 is made of silicon and the fin structures 202 are also made of silicon.

The plurality of fin structures 202 may be fabricated by a process including the following steps. First, an initial substrate may be provided. A patterned hard mask layer may then be formed on the surface of the initial substrate. Further, the initial substrate may be etched using the patterned hard mask layer as an etch mask. After etching, the etched initial substrate may become the substrate 201 and the plurality of protrusions formed on the surface of the substrate 201 may become the fin structures 202.

In one embodiment, the isolation layer 203 may be made of $SiO_x$. In other embodiments, the isolation layer may also be made of $SiN_x$ or SiON.

The Fin-FET device may also include an N-type gate structure formed in the NMOS region II and a P-type gate structure formed in the PMOS region I. Specifically, the N-type gate structure may be formed in the interlayer dielectric layer 204 and on a portion of the top and the sidewall surfaces of the fin structure 202 in the NMOS region II and the P-type gate structure may be formed in the interlayer dielectric layer 204 and on a portion of the top and the sidewall surfaces of the fin structure 202 in the PMOS region I.

The N-type gate structure may further include a high-k dielectric layer 206 formed on a portion of the top and sidewall surfaces of the fin structure 202 and also on the sidewall surfaces of a first opening 210 (referring to FIG. 3) formed in the interlayer dielectric layer 204 for the subsequent fabrication of the N-type gate structure, a second work function layer 208 formed on the high-k dielectric layer 206, an N-type work function layer 209 formed on the second work function layer 208, and a metal layer 303 formed on the N-type work function layer 209. The P-type gate structure may further include a high-k dielectric layer 206 formed on a portion of the top and sidewall surfaces of the fin structure 202 and also on the sidewall surfaces of a second opening 220 (referring to FIG. 3) formed in the interlayer dielectric layer 204 for the subsequent fabrication of the P-type gate structure, a first work function layer 207 formed on the high-k dielectric layer 206, a second work function layer 208 formed on the first work function layer 207, an N-type work function layer 209 formed on the second work function layer 208, and a metal layer 303 formed on the N-type work function layer 209.

The Fin-FET device may also include an interface layer 205 formed between the fin structure 202 and the high-k dielectric layer 206 in both the N-type gate structure and the P-type gate structure. In addition, the Fin-FET device may further include a cap layer 302 formed between the N-type work function layer 209 and the metal layer 303 in both the N-type gate structure and the P-type gate structure.

The Fin-FET device may also include a first source/drain doped region 212 formed in the fin structure 202 on each side of the N-type gate structure in the NMOS region II and a second source/drain doped region 211 formed in the fin structure 202 on each side of the P-type gate structure in the PMOS region I.

In addition, the Fin-FET device may include a sidewall spacer 200 formed between each sidewall surface of the N-type gate structure and the interlayer dielectric layer 204 as well as between each sidewall surface of the P-type gate structure and the interlayer dielectric layer 204.

During the formation process for the Fin-FET device, the first work function layer 207 may be simultaneously formed in the first opening 210 (referring to FIG. 3) in the NMOS region II and also in the second opening 220 (referring to FIG. 3) in the PMOS region I. The portion of the first work function layer 207 formed in the first opening 210 may then be removed prior to forming the second work function layer 208 in both the first opening 210 and the second opening 220.

Moreover, after forming the N-type work function layer 209, a back-flow annealing process 301 may be performed (referring to FIGS. 11-12) on the N-type work function layer 209.

In one embodiment, the back-flow annealing process 301 may allow the Al ions in the N-type work function layer in the corner region to be diffused into the second work function layer 208 formed in the first opening 210 so that the thickness of the second work function layer 208 in the corner region may become smaller. Therefore, the barrier height due to the portion of the work function layer 208 in the corner region may be reduced, and the effective channel length in the NMOS region II may become longer. As such, the controllability of a subsequently-formed first gate structure in the NMOS region II on the channel region may be improved, and thus the electrical performance of the formed Fin-FET device may also be improved.

During the back-flow annealing process 301, the portion of the N-type work function layer 209 formed on the sidewall of the first opening 210 may be in a melted state. Further, the portion of the N-type work function layer 209 formed on the sidewall of the first opening 210 may tend to accumulate in the corner region under the action of gravity, leading to an increased thickness for the N-type work function layer in the corner region. Moreover, during the back-flow annealing process 301, the Al ions in the N-type work function layer may diffuse into the barrier layer, and thus a portion of the barrier layer may be converted to a portion of the N-type work function layer 209. Specifically, the Al ions in the portion of the N-type work function layer 209 in the corner region may diffuse into the barrier layer. Because the thickness of the portion of the N-type work function layer 209 in the corner region may be large, the concentration of Al ions diffused into the barrier layer in the corner region may also be large. Therefore, after the back-flow annealing process, the concentration of Al ions in the barrier layer situated in the corner region may be large. Further, the distance that the Al ions are diffused into the barrier layer in the corner region may be large. That is, the portion of the barrier layer converted into a portion of the N-type work function layer may have a large thickness. Therefore, after performing the back-flow annealing process 301, the thickness of the barrier layer in the corner region may be smaller than the thickness of the barrier layer in other regions of the semiconductor structure.

The annealing temperature during the back-flow annealing process may not be too low or too high. Specifically, when the annealing temperature is too low, the flowability of the N-type work function layer 209 may not be desired, and thus the thickness of the N-type work function layer 209 in the corner region may still be small after the back-flow annealing process. As such, the number of the Al ions diffused into the barrier layer in the corner region may also be small. When the annealing temperature is too high, the Al ions may penetrate through the barrier layer and enter the high-k dielectric layer 206, and thus affect the property of the high-k dielectric layer 206. Similarly, because the concentration of Al ions in the barrier layer formed in the corner region may be relatively high, to prevent the Al ions from diffusing into the high-k dielectric layer 206, the annealing time may also be controlled within a reasonable range.

In one embodiment, the process parameters used in the back-flow annealing process 301 may include an annealing temperature in a range of approximately 100° C. to 300° C., an annealing time in a range of approximately 10 min to 12 min, and a process environment including $N_2$, Ar, or He.

In one embodiment, the portion of each fin structure 202 formed above the top surface of the isolation layer 203 may include a fin-structure bottom region and a fin-structure top region situated above the fin-structure bottom region. The back-flow annealing process 301 may also decrease the thickness of the portion of the N-type work function layer 209 formed on the sidewall surface of the fin-structure bottom region.

Because the isolation layer 203 between neighboring fin structures 202 shows a curved-in top surface, during the back-flow annealing process 301, the melted N-type work function layer 209 may accumulate on the curved-in surface so that the thickness of the portion of the N-type work function layer formed on the sidewall of the fin-structure bottom region may be smaller.

Further, the bottom dimension of each fin structure 202 formed above the isolation layer may be greater than the top dimension of the fin structure 202. Therefore, compared to the portion of the subsequently-formed gate structure on the top region of the fin structure 202, the portion of the gate structure on the fin-structure bottom region may demonstrate weaker controllability on the short channel of the channel region. Thus, the source-drain punch through problem may easily occur in the fin-structure bottom region. In one embodiment, as the portion of the N-type work function layer 209 formed on the sidewall of the fin-structure bottom region becomes thinner, the threshold voltage of the portion of the device corresponding to the fin-structure bottom region may increase. The increase in the threshold voltage of the portion of the device that corresponds to the fin-structure bottom region may compensate or counteract the weak short-channel controllability caused by the large width of the tin-structure bottom region. Therefore, the portion of the subsequently-formed first gate structure in the fin-structure bottom region may also demonstrate desired short-channel controllability, and thus the source-drain punch through problem may not occur in the fin-structure bottom region.

The first work function layer 207 may be made of a P-type work function material and the second work function layer 208 may also be made of a P-type work function material. The N-type work function layer 209 may be made of an N-type work function material containing Al ions, such as TiAl, TiAlC, TiAlN, and AlN.

In one embodiment, prior to performing the back-flow annealing process 301, the thickness of the portion of the N-type work function layer 209 formed on the sidewall surface of the fin-structure bottom region may be in a range of approximately 33 Å to 88 Å. After the completion of the back-flow annealing process 301, the thickness of the portion of the N-type work function layer 209 on the sidewall surface of the fin-structure bottom region may not be too small; otherwise, the threshold voltage of the channel region in the portion of the device corresponding to the fin-structure bottom region may be too large, leading to an overly large required voltage for switching the channel region. Moreover, after the completion of the back-flow annealing process 301, the thickness of the portion of the N-type work function layer 209 on the sidewall surface of the fin-structure bottom region may not be too large either; otherwise, the short-channel controllability of the subsequently-formed first gate structure in the region corresponding to the fin-structure bottom region may still be weak.

Therefore, in one embodiment, after performing the back-flow annealing process 301, the thickness of the portion of the N-type work function layer 209 formed on the sidewall surface of the fin-structure bottom region may be in a range of approximately 30 Å to 80 Å.

According to the disclosed fabrication method, a back-flow annealing process 301 may be performed on the N-type work function layer 209. The back-flow annealing process 301 may be able to increase the thickness of the portion of the N-type work function layer 209 formed in the corner region at the joint between the bottom and the sidewall of the first opening 210. In addition, the back-flow annealing process 301 may also allow the Al ions in the N-type work function layer 209 in the corner region to be diffused into the barrier layer.

Because the thickness of the portion of the N-type work function layer 209 in the corner region may be large, the concentration of Al ions diffused into the barrier layer in the corner region may also be large. Further, compared to the Al ions in other regions, the Al ions in the corner region may demonstrate better ability to diffuse into the barrier layer. Therefore, the overly large barrier height due to the barrier layer in the corner region may be significantly suppressed. That is, the barrier height associated with the portion of the barrier layer formed in the corner region may be significantly reduced. Thus, the length of the effective channel region in the NMOS region may increase. Specifically, the effective channel region may also be formed in the fin structure under the portion of the barrier layer that contains Al ions.

Therefore, compared to existing Fin-FET devices, the disclosed Fin-FET device may have an extended effective channel region in the fin structure. Therefore, the disclosed fabrication methods and Fin-FET devices may suppress the SCEs and improve the electrical performance of the formed devices.

Further, the back-flow annealing process 301 may also decrease the thickness of the portion of the N-type work function layer 209 formed on the sidewall surface of the fin-structure bottom region. Therefore, the threshold voltage of the first gate structure corresponding to the fin-structure bottom region may be large so that the weak short-channel controllability caused by a large width of the fin-structure bottom region may be compensated or counteracted. Therefore, the first gate structure formed in the fin-structure bottom region may also demonstrate desired short-channel controllability on the channel region, preventing the source-drain punch through problem from occurring at the fin-structure bottom region. As such, the electrical performance of the formed Fin-FET device may be further improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a Fin-FET device, comprising:
   forming a plurality of fin structures, an isolation layer, and an interlayer dielectric layer, on a substrate, wherein the substrate includes an N-type metal-oxide-semiconductor (NMOS) region, the plurality of fin structures extend in the NMOS region, the isolation layer covers a portion of sidewall surfaces of the plurality of fin structures and has a top surface lower than top surfaces of the plurality of fin structures, the interlayer dielectric layer covers the isolation layer;
   forming a first opening in the interlayer dielectric layer, wherein the first opening is formed across the plurality of fin structures in the NMOS region and exposes a portion of top and sidewall surfaces of the plurality of fin structures in the NMOS region, and a corner region is adjacent to a joint between a bottom surface and a sidewall surface of the first opening;
   forming a high-k dielectric layer on the bottom surface and the sidewall surface of the first opening, wherein the high-k dielectric layer covers the portion of the top and the sidewall surfaces of the plurality of fin structures exposed in the first opening;
   forming a barrier layer on the high-k dielectric layer in the first opening;
   forming an N-type work function layer on the barrier layer, wherein the N-type work function layer is made of an N-type work function material containing aluminum ions;
   performing an annealing process on the N-type work function layer such that the N-type work function layer has a thickened portion at the corner region and a portion of the N-type work function layer at the corner region includes diffused aluminum ions; and
   forming a metal layer on the N-type work function layer to fill up the first opening.

2. The method for fabricating the Fin-FET device according to claim 1, wherein a portion of each fin structure formed above a top surface of the isolation layer further includes:
   a fin-structure bottom region; and
   a fin-structure top region situated above the fin-structure bottom region, wherein:
      the annealing process leads to a decreased thickness for a portion of the N-type work function layer formed on the fin-structure bottom region.

3. The method for fabricating the Fin-FET device according to claim 2, wherein:
   prior to performing the annealing process, the thickness of the portion of the N-type work function layer formed on the fin-structure bottom region is in a range of approximately 33 Å to 88 Å; and
   after performing the back flow annealing process, the thickness of the portion of the N-type work function layer formed on the fin-structure bottom region is in a range of approximately 30 Å to 80 Å.

4. The method for fabricating the Fin-FET device according to claim 1, wherein:
   the top surface of the isolation layer formed between neighboring fin structures is curved in.

5. The method for fabricating the Fin-FET device according to claim 1, wherein process parameters used in the annealing process include:
   an annealing temperature in a range of approximately 100° C. to 300° C.; and
   an annealing time in a range of approximately 10 min to 20 min.

6. The method for fabricating the Fin-FET device according to claim 1, wherein:
   the N-type work function layer is made of one of TiAl, TiAlC, TiAlN, and AlN.

7. The method for fabricating the Fin-FET device according to claim 1, wherein:
   the barrier layer is made of one of TiN and TaN.

8. The method for fabricating the Fin-FET device according to claim 1, wherein:
   prior to performing the annealing process, a thickness of the barrier layer is in a range of approximately 10 Å to 20 Å.

9. The method for fabricating the Fin-FET device according to claim 1, wherein:

a width of the bottom region of the plurality of fin structures formed above the top surface of the isolation layer is larger than a width of the top region of the plurality of fin structures.

10. The method for fabricating the Fin-FET device according to claim 1, wherein:
the substrate also includes a P-type metal-oxide-semiconductor (PMOS) region,
the plurality of fin structures extend in the PMOS region; and
a second opening is formed in the interlayer dielectric layer, wherein the second opening is formed across the plurality of fin structures in the PMOS region and exposes a portion of top and sidewall surfaces of the plurality of fin structures in the PMOS region.

11. The method for fabricating the Fin-FET device according to claim 10, wherein:
a high-k dielectric layer is formed on a bottom surface and a sidewall surface of the second opening;
a P-type work function layer is formed on the high-k dielectric layer in the second opening; and
a metal layer is formed on the P-type work function layer and fills up the second opening.

12. The method for fabricating the Fin-FET device according to claim 11, wherein forming the high-k dielectric layer, the barrier layer and the P-type work function layer includes:
forming the high-k dielectric layer on the bottom surface and the sidewall surface of the first opening, wherein the high-k dielectric layer is also simultaneously formed on the bottom surface and the sidewall surface of the second opening;
forming a first work function layer on the high-k dielectric layer in both the first opening and the second opening;
removing a portion of the first work function layer formed in the first opening to expose the high-k dielectric layer in the first opening; and
forming a second work function layer on the high-k dielectric layer in the first opening and the first work function layer in the second opening, wherein:
a portion of the second work function layer formed in the first opening serves as the barrier layer; and
a portion of the first work function layer together with a portion of the second work function layer formed in the second opening serve as the P-type work function layer.

13. The method for fabricating the Fin-FET device according to claim 11, wherein:
the first work function layer is made of one of TiN and TaN; and
the second work function layer is made of one of TiN and TaN.

14. The method for fabricating the Fin-FET device according to claim 1, prior to forming the metal layer, further including:
forming a cap layer on the N-type work function layer; and
the cap layer is made of one of TiN and TaN.

15. The method for fabricating the Fin-FET device according to claim 1, wherein the high-k dielectric layer is made of one of $HfO_2$, HfSiO, HfSiON, HfTaO, HfSiO, HfZrO, $ZrO_2$, and $Al_2O_3$.

16. The method for fabricating the Fin-FET device according to claim 1, wherein the metal layer is made of one of Cu, Al, and W.

17. The method for fabricating the Fin-FET device according to claim 1, wherein the high-k dielectric layer, the barrier layer, and the N-type work function layer are also formed on a portion of the top surface of the interlayer dielectric layer prior to forming the metal layer; accordingly, forming the metal layer includes:
forming a metal film on the N-type work function layer to fill up the first opening, wherein a top surface of the metal film is higher than the top surface of the interlayer dielectric layer; and
removing the portion of the metal film, the high-k dielectric layer, the barrier layer, and the N-type work function layer formed above the top surface of the interlayer dielectric layer.

* * * * *